US011417793B2

(12) United States Patent
Yamamoto et al.

(10) Patent No.: US 11,417,793 B2
(45) Date of Patent: Aug. 16, 2022

(54) METHOD OF MANUFACTURING SEMICONDUCTOR OPTICAL DEVICE AND SEMICONDUCTOR OPTICAL DEVICE

(71) Applicant: DOWA Electronics Materials Co., Ltd., Tokyo (JP)

(72) Inventors: Jumpei Yamamoto, Akita (JP); Tetsuya Ikuta, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 229 days.

(21) Appl. No.: 16/831,804

(22) Filed: Mar. 27, 2020

(65) Prior Publication Data

US 2020/0227585 A1 Jul. 16, 2020

Related U.S. Application Data

(62) Division of application No. 16/311,816, filed as application No. PCT/JP2017/020050 on May 30, 2017.

(30) Foreign Application Priority Data

Jun. 30, 2016 (JP) ................................. 2016-129547

(51) Int. Cl.
*H01L 33/00* (2010.01)
*H01L 33/30* (2010.01)
(Continued)

(52) U.S. Cl.
CPC ...... *H01L 33/0062* (2013.01); *H01L 33/0093* (2020.05); *H01L 33/06* (2013.01);
(Continued)

(58) Field of Classification Search
CPC ......... H01L 2933/0016; H01L 33/0062; H01L 33/0093; H01L 33/06; H01L 33/10; H01L 33/30; H01L 33/38; H01L 33/405
See application file for complete search history.

(56) References Cited

U.S. PATENT DOCUMENTS

| 6,362,069 B1 | 3/2002 | Forrest et al. |
| 11,205,739 B2 * | 12/2021 | Yamamoto .............. H01L 33/22 |

(Continued)

FOREIGN PATENT DOCUMENTS

| JP | H06224404 A | 8/1994 |
| JP | H06237042 A | 8/1994 |

(Continued)

OTHER PUBLICATIONS

Aug. 27, 2020, Office Action issued by the China National Intellectual Property Administration in the corresponding Chinese Patent Application No. 201780039013.1.

(Continued)

*Primary Examiner* — Meiya Li
(74) *Attorney, Agent, or Firm* — Kenja IP Law PC

(57) ABSTRACT

Provided is a method of manufacturing a semiconductor optical device, which makes it possible to reduce the thickness of a semiconductor optical device including InGaAsP-based III-V compound semiconductor layers containing at least In and P to a thickness smaller than that of conventional devices, and provide a semiconductor optical device. The method of manufacturing a semiconductor optical device includes a step of forming a semiconductor laminate on the InP growth substrate; a step of bonding the semiconductor laminate to the support substrate formed from a Si substrate, with at least the metal bonding layer therebetween; and a step of removing the InP growth substrate.

5 Claims, 8 Drawing Sheets

(51) Int. Cl.
*H01L 33/06* (2010.01)
*H01L 33/10* (2010.01)
*H01L 33/38* (2010.01)
*H01L 33/40* (2010.01)

(52) U.S. Cl.
CPC ............ *H01L 33/10* (2013.01); *H01L 33/30* (2013.01); *H01L 33/38* (2013.01); *H01L 33/405* (2013.01); *H01L 2933/0016* (2013.01)

(56) References Cited

U.S. PATENT DOCUMENTS

| | | |
|---|---|---|
| 2003/0213950 A1 | 11/2003 | Hwang |
| 2008/0157109 A1 | 7/2008 | Hon |
| 2008/0283819 A1 | 11/2008 | Konno |
| 2008/0315176 A1 | 12/2008 | Takeuchi et al. |
| 2011/0089440 A1* | 4/2011 | Park ................... H01L 25/0756 257/E33.072 |
| 2013/0248918 A1* | 9/2013 | Miyachi ................ H01L 33/20 438/26 |
| 2017/0012171 A1 | 1/2017 | Ko |
| 2017/0033533 A1 | 2/2017 | Hamaguchi et al. |

FOREIGN PATENT DOCUMENTS

| | | |
|---|---|---|
| JP | H07147454 A | 6/1995 |
| JP | 2001156324 A | 6/2001 |
| JP | 2008283096 A | 11/2008 |
| JP | 2014204095 A | 10/2014 |
| JP | 2015015393 A | 1/2015 |
| JP | 2015032598 A | 2/2015 |
| WO | 2008135013 A2 | 11/2008 |
| WO | 2013073485 A1 | 5/2013 |
| WO | 2014167773 A1 | 10/2014 |

OTHER PUBLICATIONS

Aug. 28, 2020, Office Action issued by the United States Patent and Trademark Office in the U.S. Appl. No. 16/311,816.
Apr. 3, 2018, Notification of Reasons for Refusal issued by the Japan Patent Office in the corresponding Japanese Patent Application No. 2016-129547.
Aug. 15, 2017, International Search Report issued in the International Patent Application No. PCT/JP2017/020050.
Aug. 8, 2017, Notification of Reasons for Refusal issued by the Japan Patent Office in the corresponding Japanese Patent Application No. 2016-129547.
Jan. 1, 2019, International Preliminary Report on Patentability issued in the International Patent Application No. PCT/JP2017/020050.
Apr. 21, 2021, Office Action issued by the United States Patent and Trademark Office in the U.S. Appl. No. 16/311,816.
Mar. 23, 2020, Office Action issued by the Korean Intellectual Property Office in the corresponding Korean Patent Application No. 10-2018-7037017.
Oct. 29, 2020, Office Action issued by the Korean Intellectual Property Office in the corresponding Korean Patent Application No. 10-2018-7037017.
Aug. 6, 2021, Office Action issued by the German Patent and Trade Mark Office in the corresponding German Patent Application No. 112017003307.1.
May 19, 2022, Office Action issued by the United States Patent and Trademark Office in the U.S. Appl. No. 16/311,816.

* cited by examiner

FIG. 3
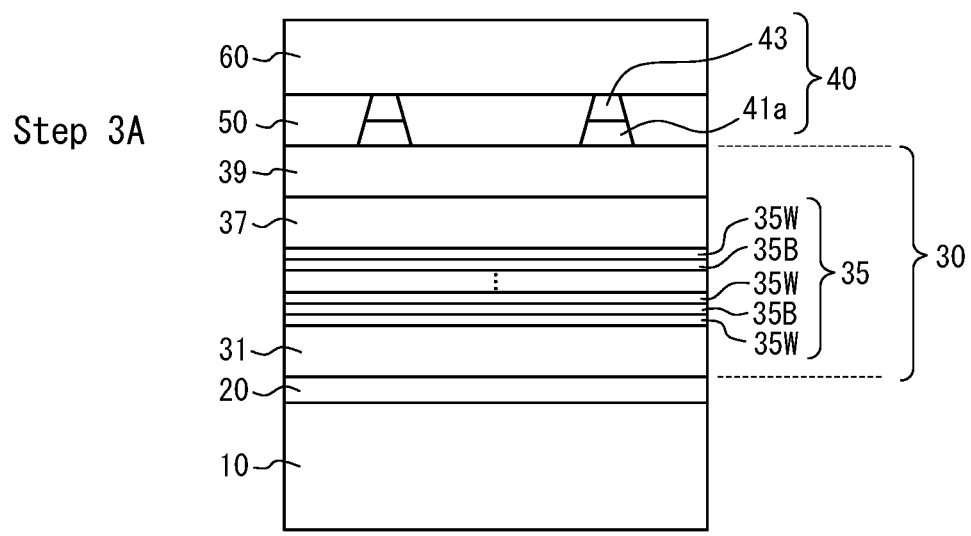
Step 3A
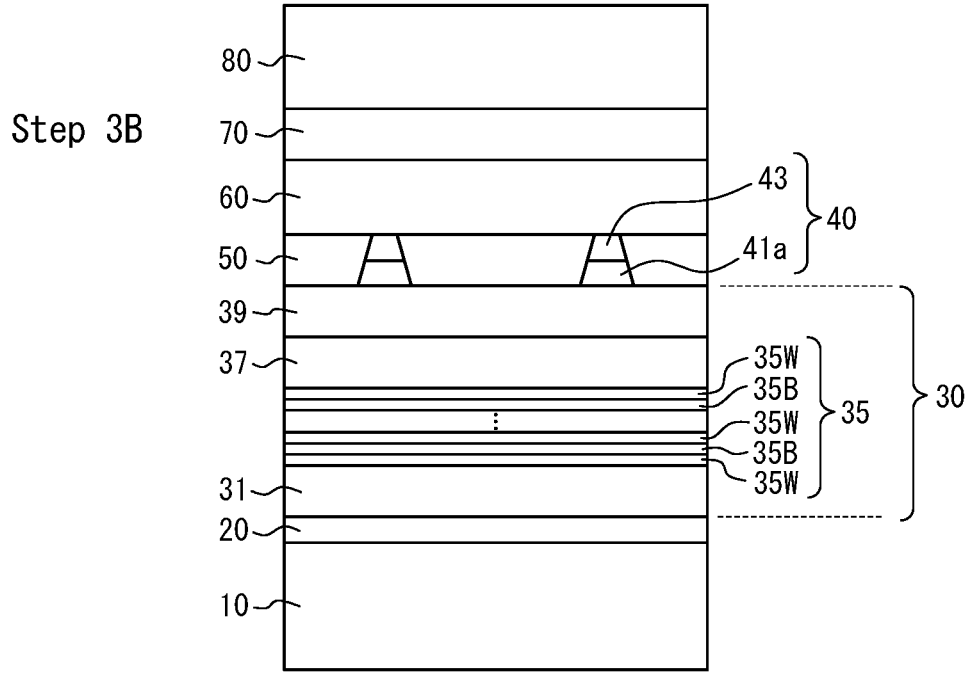
Step 3B

FIG. 4
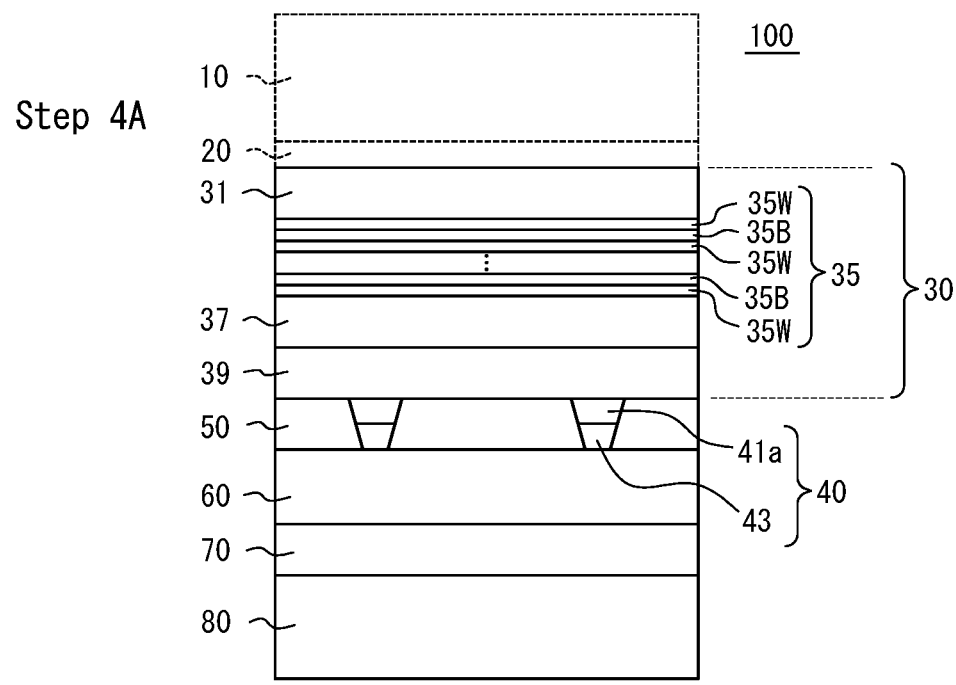
Step 4A
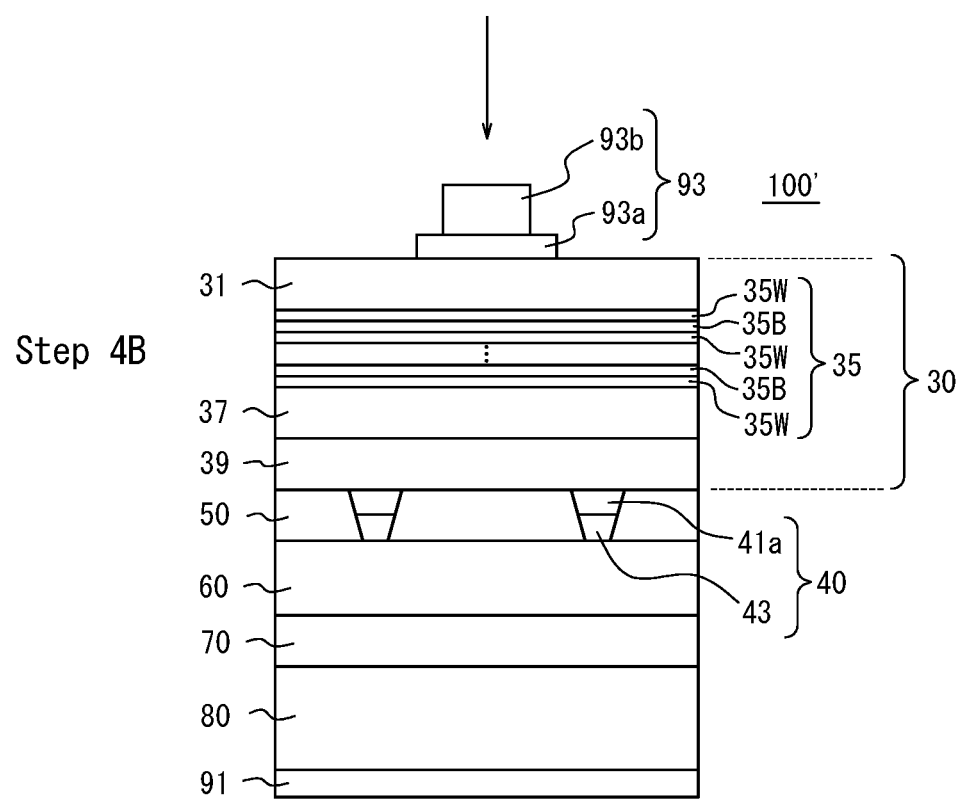
Step 4B

METHOD OF MANUFACTURING SEMICONDUCTOR OPTICAL DEVICE AND SEMICONDUCTOR OPTICAL DEVICE

CROSS-REFERENCE TO RELATED APPLICATION

This application is a divisional application of U.S. application Ser. No. 16/311,816 filed Dec. 20, 2018, which is a National Stage Application of PCT/JP2017/020050 filed May 30, 2017, which claims priority based on Japanese Patent Application No. 2016-129547 filed Jun. 30, 2016. The disclosures of the prior applications are hereby incorporated by reference herein in their entirety.

TECHNICAL FIELD

This disclosure relates to a method of manufacturing a semiconductor optical device and a semiconductor optical device

BACKGROUND

Conventionally, semiconductor optical devices which emit or receive light in the infrared region are known, such as infrared emission semiconductor light-emitting diodes which emit light with a wavelength of 750 nm or more in the infrared region, and infrared range semiconductor light receiving devices which detect light with wavelengths in the infrared region. For example, infrared emission semiconductor light-emitting diodes are widely used in the applications such as sensors, gas analysis, and surveillance cameras.

When reception or emission wavelengths of such a semiconductor optical device are 1000 nm to 2200 nm in the near infrared region, a p-n junction area formed from an InGaAsP-based III-V semiconductor containing In and P is usually formed. Conventionally, when an InGaAsP-based III-V semiconductor layer such as an InP layer is epitaxially grown, an InP substrate is used as a growth substrate so that the growth substrate and the InGaAsP-based III-V semiconductor layer containing In and P are lattice matched.

For example, JP H07-147454 A (PTL 1) discloses a semiconductor laser diode emitting at wavelengths in the 1.3 μm range. This semiconductor laser has a strained multiple quantum well active layer formed on an n-type InP substrate, and the strained multiple quantum well active layer has a structure in which InGaAsP strained quantum wells and InGaAsP barrier layers are alternately stacked.

Further, JP H06-237042 A (PTL 2) describes that InGaAsP barrier layers having the same lattice constant as an InP substrate, and quantum well layers including strained quantum well layers each formed from an $In_{0.3}Ga_{0.7}As$ layer having a smaller lattice constant than the InP substrate and lattice strain compensation layers each formed of InAs having a larger lattice constant than the InP substrate are provided on the InP substrate.

Further, JP 2001-156324 A (PTL 3) discloses a near infrared range semiconductor light receiving device in which an InAsP buffer layer is formed on an InP substrate, an InGaAs light absorption layer having the same lattice constant as the InP substrate is formed on the buffer layer, and an InAsP window layer is formed on the light absorption layer.

CITATION LIST

Patent Literature

PTL 1: JP H07-147454 A
PTL 2: JP H06-237042 A
PTL 3: JP 2001-156324 A

SUMMARY

Technical Problem

In each of the techniques described in PTL 1, PTL 2, and PTL 3, the InP substrate as the growth substrate is used directly as a support substrate of the semiconductor optical device. This does not affect transparency to infrared light, since the InP substrate is transparent to light in the near infrared region.

In recent years, there is a demand for smaller semiconductor optical devices which receives or emits light in the infrared region, with increase in demand for wearable devices. In particular, there is an increasing demand for semiconductor optical devices to have a smaller thickness (i.e., devices having a smaller total thickness).

Here, the thickness of a commercially available InP substrate is typically 350 μm or more for a 2 in substrate. On the other hand, the thickness of an InGaAsP-based III-V semiconductor layer, an electrode, etc. provided other than the InP substrate in a semiconductor optical device is several micrometers at most. Accordingly, a substrate dominates a semiconductor optical device in thickness. The inventors of this disclosure contemplated epitaxially growing an InGaAsP-based III-V semiconductor layer on an InP substrate and then grinding the InP substrate by ⅓ or more of the original thickness. However, since an InP substrate is brittle, the InP substrate would be broken if the InP substrate is excessively ground to less than 200 μm, for example 150 μm or less. Therefore, the thickness of a near infrared range semiconductor optical device could not be reduced sufficiently.

Given these circumstances, it could be helpful to provide a method of manufacturing a semiconductor optical device, which makes it possible to reduce the thickness of a semiconductor optical device including InGaAsP-based III-V compound semiconductor layers containing at least In and P to a thickness smaller than that of conventional devices, and to provide a semiconductor optical device.

Solution to Problem

The inventors of this disclosure diligently studied ways to address the above problems, and conceived a bonding process method. Then they contemplated removing an InP growth substrate using an Si substrate which can be made thin to serve as a support substrate. This idea led to disclosure.

Specifically, we propose the following features.

(1) A method of manufacturing a semiconductor optical device, comprising:
a step of forming a semiconductor laminate in which a plurality of InGaAsP-based III-V compound semiconductor layers containing at least In and P are stacked, on an InP growth substrate;
a step of bonding the semiconductor laminate to a conductive support substrate formed from a Si substrate with at least a metal bonding layer therebetween; and
a step of removing the InP growth substrate.

(2) The method of manufacturing a semiconductor optical device, according to (1) above, further comprising a grinding step of grinding the conductive support substrate to a thickness in a range of 80 μm or more and less than 200 μm.

(3) A method of manufacturing a semiconductor optical device, comprising:

a first step of forming a semiconductor laminate in which a plurality of InGaAsP-based III-V compound semiconductor layers containing at least In and P are stacked, on an InP growth substrate;

a second step of forming a contact layer formed of a III-V compound semiconductor on the semiconductor laminate;

a third step of forming an ohmic metal portion on part of the contact layer leaving an exposed area on a surface of the contact layer;

a fourth step of removing the contact layer of the exposed area so that a surface of the semiconductor laminate is exposed, thereby forming a contact portion composed of the ohmic metal portion and the contact layer and forming an exposed surface of the semiconductor laminate;

a fifth step of forming a dielectric layer on at least part of the exposed surface of the semiconductor laminate;

a sixth step of forming a reflective metal layer mainly containing Au on the dielectric layer and the contact portion;

a seventh step of bonding a conductive support substrate having a surface provided with a metal bonding layer to the reflective metal layer with the metal bonding layer therebetween; and an eighth step of removing the InP growth substrate, wherein the support substrate is a conductive Si substrate.

(4) The method of manufacturing a semiconductor optical device, according to (3) above, further comprising a grinding step of grinding the conductive support substrate to a thickness in a range of 80 μm or more and less than 200 μm.

(5) The method of manufacturing a semiconductor optical device, according to (3) or (4) above, wherein the semiconductor laminate includes an n-type cladding layer, an active layer, and a p-type cladding layer in this order, and the n-type cladding layer, the active layer, and the p-type cladding layer are layers formed of an InGaAsP-based III-V compound semiconductor containing at least In and P.

(6) The method of manufacturing a semiconductor optical device, according to (5) above, wherein the semiconductor laminate has one of a double heterostructure and a multiple quantum-well structure.

(7) The method of manufacturing a semiconductor optical device, according to any one of claims 3 to 6, wherein the dielectric layer is formed of $SiO_2$.

(8) A semiconductor optical device comprising:

a conductive support substrate formed from a Si substrate;

a metal bonding layer provided on a surface of the conductive support substrate; and a semiconductor laminate in which a plurality of InGaAsP-based III-V compound semiconductor layers containing at least In and P are stacked, the semiconductor laminate being provided on the metal bonding layer.

(9) The semiconductor optical device according to (8) above, wherein a thickness of the conductive support substrate is in a range of 80 μm or more and less than 200 μm.

(10) A semiconductor optical device comprising:

a conductive support substrate;

a metal bonding layer provided on a surface of the conductive support substrate;

a reflective metal layer provided on the metal bonding layer;

a semiconductor laminate in which a plurality of InGaAsP-based III-V compound semiconductor layers containing at least In and P are stacked, the semiconductor laminate being provided on the reflective metal layer; and a dielectric layer and a contact portion that are provided in parallel between the reflective metal layer and the semiconductor laminate, the reflective metal layer mainly contains Au, and the conductive support substrate is formed from a conductive Si substrate.

(11) The semiconductor optical device according to (10) above, wherein a thickness of the conductive support substrate is in a range of 80 μm or more and less than 200 μm.

(12) The semiconductor optical device according to (10) or (11) above, wherein the semiconductor laminate includes an n-type cladding layer, an active layer, and a p-type cladding layer in this order, and the n-type cladding layer, the active layer, and the p-type cladding layer are layers formed of an InGaAsP-based III-V compound semiconductor containing at least In and P.

(13) The semiconductor optical device according to (12) above, wherein the semiconductor laminate has one of a double heterostructure and a multiple quantum-well structure.

(14) The semiconductor optical device, according to any one of (10) to (13) above, wherein the dielectric layer is formed of $SiO_2$.

Advantageous Effect

This disclosure can provide a method of manufacturing a semiconductor optical device, which makes it possible to reduce the thickness of a semiconductor optical device including InGaAsP-based III-V compound semiconductor layers containing at least In and P to a thickness smaller than that of conventional devices, and provide a semiconductor optical device.

BRIEF DESCRIPTION OF THE DRAWINGS

In the accompanying drawings,

FIG. 3 presents schematic cross-sectional views illustrating Steps 3A and 3B of the manufacturing process of a semiconductor light-emitting diode according to the first embodiment of this disclosure;

FIG. 4 presents schematic cross-sectional views illustrating Steps 4A and 4B of the manufacturing process of a semiconductor light-emitting diode according to the first embodiment of this disclosure;

DETAILED DESCRIPTION

Prior to describing embodiments of this disclosure, the following points are described beforehand. First, in this specification, the expression "InGaAsP" alone for which the composition ratio is not specified means a given compound having a chemical composition ratio of group III elements (In and Ga in total) with respect to group V elements (As and P) of 1:1, in which the ratio between In and Ga that are group III elements and the ratio between As and P that are group V elements are undefined. In this case, there may be a possibility that one of In and G is not contained as the group III elements; or there may be a possibility that one of As and P is not contained as the group V elements. However, InGaAsP specified as "containing at least In and P" means that more than 0% and 100% or less of In is contained in the group III elements, and 0% and 100% or less of P is contained in the group V elements. Further, the expression "InGaP" means that As is not contained in "InGaAsP" above, and the expression "InGaAs" means that P is not contained in "InGaAsP" above. Similarly, the expression "InAsP" means that Ga is not contained in "InGaAsP" above, and the expression "GaAsP" means that In is not contained in "InGaAsP" above. Further, the expression "InP" means that Ga and As are not contained in "InGaAsP" above. Note that the ratio between the components of InGaAsP can be measured for example by a photoluminescence measurement or an X-ray diffraction measurement.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Zn, S, and Sn and does not serve as an electrically p-type or n-type layer is referred to as an "i-type" or "undoped" layer. An undoped InGaAsP layer may contain impurities that are inevitably mixed in the production process. Specifically, when the carrier density is low (for example, less than $4 \times 10^{16}/cm^3$), the layer is handled as being "undoped" in this specification. Further, the values of the impurity concentrations of Zn, Sn, etc. are determined by SIMS analysis.

The total thickness of the layers formed can be measured using a thickness measurement system using optical interferometry. Moreover, the thickness of each layer can be calculated by observing a cross section of the growth layer using a thickness measurement system using optical interferometry and a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

Figure 5:
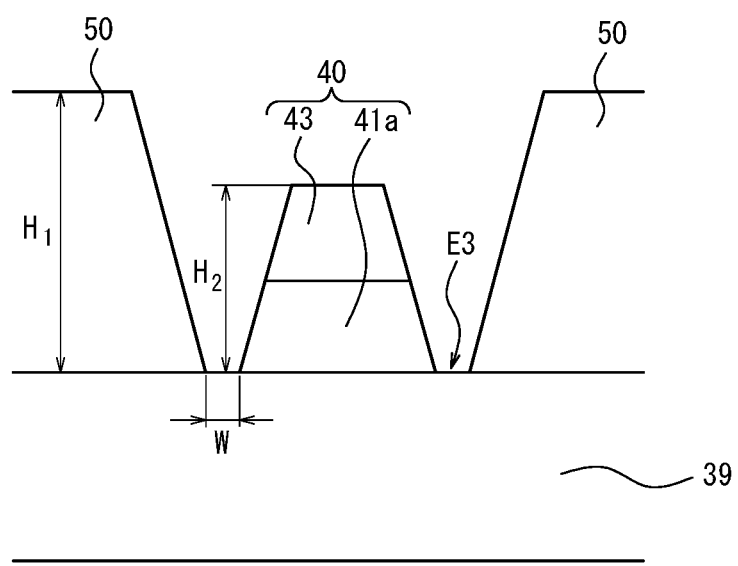
FIG. 5 is a schematic view illustrating the periphery of a dielectric layer and a contact portion of a semiconductor light-emitting diode according to a preferred aspect of the first embodiment of this disclosure.

A semiconductor optical device of this disclosure may take two forms: a semiconductor light-emitting diode and a semiconductor light receiving device. First, a semiconductor light-emitting diode of the first embodiment will be described with reference to the drawings. Prior to describing an embodiment of the method of manufacturing a semiconductor light-emitting diode according to the first embodiment, the relationship between FIGS. 1 to FIG. 5 is described beforehand. FIG. 1 to FIG. 4 present schematic cross-sectional views illustrating steps of a method of manufacturing a semiconductor light-emitting diode according to the first embodiment of this disclosure. This semiconductor light-emitting diode can be manufactured in the order of Steps 1A to 1C in FIG. 1, Steps 2A to 2C in FIG. 2, Steps 3A and 3B in FIG. 3, and Steps 4A and 4B in FIG. 4. FIG. 5 is an enlarged view of the periphery of a dielectric layer 50 and a contact portion 40 of a preferred aspect which are preferably formed in Step 2C of FIG. 2. In principle, components that are identical or corresponding to each other are herein denoted by the same reference numerals, and thus a description thereof will not be repeated also in the embodiment to be described with reference to FIG. 6. A substrate and layers in each diagram are exaggerated in width and thickness for convenience of description, so that the ratio between the vertical and horizontal dimensions of each illustrated component does not conform to the actual ratio.

First Embodiment: Method of Manufacturing Semiconductor Light-Emitting Diode

A method of manufacturing a semiconductor light-emitting diode 100, according to the first embodiment of this disclosure has a first step, a second step, a third step, a fourth step, a fifth step, a sixth step, a seventh step, and an eighth step to be described in detail below. In the first step, a semiconductor laminate 30 in which a plurality of InGaAsP-based III-V compound semiconductor layers containing at least In and P are stacked is formed on an InP growth substrate 10 (Steps 1A and 1B in FIG. 1). In the second step, a contact layer 41 formed of a III-V compound semiconductor is formed on the semiconductor laminate 30 (Step 1C in FIG. 1). In the third step, an ohmic metal portion 43 is formed on part of the contact layer 41 leaving an exposed area E1 on a surface of the contact layer 41 (Step 2A in FIG. 2). In the fourth step, the contact layer 41 of the exposed area E1 is removed so that a surface of the semiconductor laminate 30 is exposed, thereby forming a contact portion 40 composed of the ohmic metal portion 43 and the contact layer 41a and forming an exposed surface E2 of the semiconductor laminate 30 (Step 2B in FIG. 2). In the fifth step, a dielectric layer 50 is formed on at least part of the exposed surface E2 of the semiconductor laminate 30 (Step 2C in FIG. 2). In the sixth step, a reflective metal layer 60 mainly containing Au is formed on the dielectric layer 50 and the contact portion 40 (Step 3A in FIG. 3). In the seventh step, a conductive support substrate 80 having a surface provided with a metal bonding layer 70 is bonded to the reflective metal layer 60 with the metal bonding layer 70 therebetween (Step 3B in FIG. 3). In the eighth step, the InP growth substrate 10 is removed (Step 4A in FIG. 4). Here, in this embodiment, the support substrate 80 is a conductive Si substrate. Thus, the semiconductor light-emitting diode 100 according to the first embodiment of this disclosure is manufactured. These steps will be sequentially described in detail below.

First Step

Figure 1:
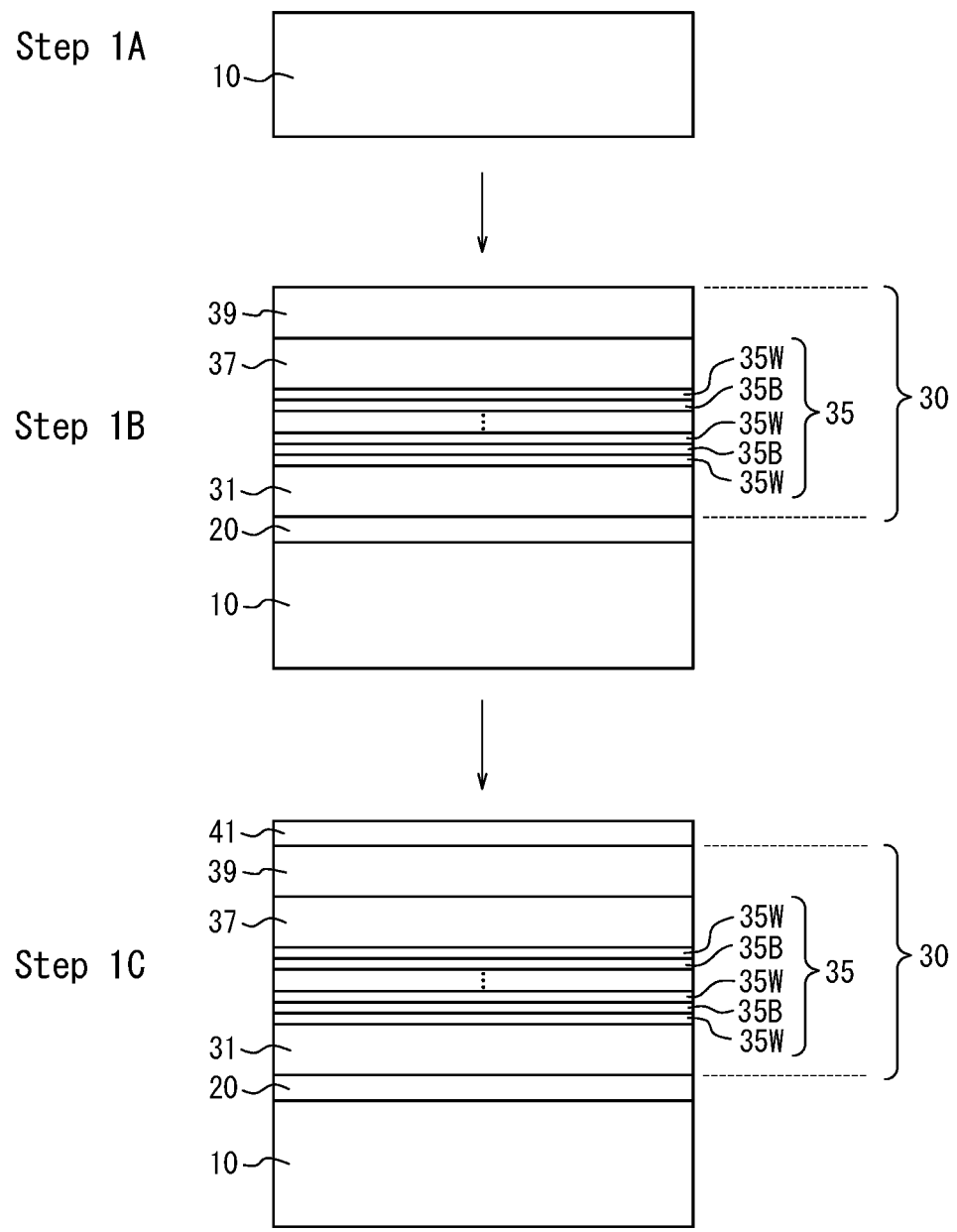
FIG. 1 presents schematic cross-sectional views illustrating Steps 1A to 1C of a manufacturing process of a semiconductor light-emitting diode according to a first embodiment of this disclosure.

As described above, the first step is a step where the semiconductor laminate 30 in which a plurality of InGaAsP-based III-V compound semiconductor layers containing at least In and P are stacked is formed on the InP growth substrate 10 (Steps 1A and 1B in FIG. 1).

In the first step, as illustrated in Step 1A of FIG. 1, the InP growth substrate 10 is first prepared. The InP growth substrate 10 may use any one of n-type InP substrate, an undoped InP substrate, and a p-type InP substrate, which are commercially available. An embodiment using an n-type InP substrate as the InP growth substrate 10 for convenience of description will be described below.

In the first step, the semiconductor laminate 30 in which a plurality of InGaAsP-based III-V compound semiconductor layers containing at least In and P are stacked is formed on the InP growth substrate 10. Preferably, the semiconductor laminate 30 includes an n-type cladding layer 31, an active layer 35, and a p-type cladding layer 37 in this order, and the n-type cladding layer 31, the active layer 35, and the p-type cladding layer 37 are layers formed of an InGaAsP-based III-V compound semiconductor containing at least In and P. The semiconductor laminate 30 may have a double hetero (DH) structure in which the active layer 35 is sandwiched between the n-type cladding layer 31 and the p-type cladding layer 37 or may have a multiple quantum well (MQW) structure. With a view to improving the light output power by reducing crystal defects, the semiconductor laminate 30 more preferably has a multiple quantum-well structure. A multiple quantum-well structure can be formed by alternately repeating well layers 35W and barrier layers 35B. The well layers 35W may be of InGaAsP, and the barrier layers 35B are preferably of InGaAsP having a larger band gap than the well layers 35W. The semiconductor laminate 30 as described above allows the semiconductor light-emitting diode 100 to emit light having a wavelength in a desired near-infrared region. For example, an emission peak wavelength of 1000 nm to 1650 nm can be achieved by changing the composition of the InGaAsP-based III-V compound. In the case of a MQW structure, an emission peak wavelength of 1000 nm to 1900 nm can be achieved by in addition to changing the composition of the InGaAsP-based III-V compound, applying strain to the well layers by controlling the composition difference between the well layers and the barrier layers. As the n-type cladding layer 31, an n-type InP cladding layer is preferably used, and as the p-type cladding layer 37, a p-type InP cladding layer is preferably used. Further, when the chemical composition of the well layers 35W is expressed as $In_{xw}Ga_{1-xw}As_{yw}P_{1-yw}$, $0.5 \leq wx \leq 1$ and $0.5 \leq yw \leq 1$ can be satisfied, and $0.6 \leq xw \leq 0.8$ and $0.3 \leq yw \leq 1$ are preferably satisfied. When the chemical composition of the barrier layers 35B is expressed as $In_{xb}Ga_{1-xb}As_{yb}P_{1-yb}$, $0.5 \leq xb \leq 1$ and $0 \leq yb \leq 0.5$ can be satisfied, and $0.8 \leq xb \leq 1$ and $0 \leq yb \leq 0.2$ are preferably satisfied.

The total thickness of the semiconductor laminate 30 may be for example, but not limited to, 2 μm to 8 μm. Similarly, the thickness of the n-type cladding layer 31 may be for example, but not limited to, 1 μm to 5 μm. Further, the thickness of the active layer 35 may be for example, but not limited to, 100 nm to 1000 nm. Similarly, the thickness of the p-type cladding layer 37 may be for example, but not limited to, 0.8 μm to 3 μm. When the active layer 35 has a quantum well structure, the thickness of the well layers 35W may be 3 nm to 15 nm, and the thickness of the barrier layers 35B may be 5 nm to 15 nm. The number of pairs of both layers may be 3 to 50.

Further, the semiconductor laminate 30 preferably has a p-type cap layer 39 formed of InGaAsP containing at least In and P on the p-type cladding layer 37. The lattice mismatch can be reduced by providing the p-type cap layer 39. The thickness of the cap layer 39 may be for example, but not limited to, 50 nm to 200 nm. In the following embodiment, for convenience of description, description is made assuming that the outermost surface layer of the semiconductor laminate 30 is the p-type cap layer 39; however, since the p-type cap layer 39 is an optional component, the outermost surface layer of the semiconductor laminate 30 may be for example, the p-type cladding layer 37.

Although not shown, the semiconductor laminate 30 preferably has an i-type InP spacer layer each between the n-type cladding layer 31 and the active layer 35 and between the active layer 35 and the p-type cladding layer. The provision of the i-type InP spacer layers can hinder dopant diffusion. The thickness of the i-type InP spacer layers may be for example, but not limited to, 50 nm to 400 nm.

Here, the layers in the semiconductor laminate 30 can be formed by epitaxial growth, for example by a known thin film deposition technique such as metalorganic chemical vapor deposition (MOCVD), molecular beam epitaxy (MBE), or sputtering. For example, trimethylindium (TMIn) may be used as an In source, trimethylgallium (TMGa) as a Ga source, arsine ($AsH_3$) as a an As source, and phosphine ($PH_3$) as a P source at a predetermined mixing ratio, and these source gases may be subjected to vapor phase epitaxy using a carrier gas to form an InGaAsP layer having a desired thickness by controlling the growth time. Note that other InGaAsP layers to be epitaxially grown may be formed in a similar manner. When the layers are p-type or n-type doped, a dopant source gas can be used in addition as desired.

Note that in the first step, before forming the semiconductor laminate 30, an etch stop layer 20 is preferably formed on the InP growth substrate 10. The etch stop layer 20 can be used when the InP growth substrate 10 is removed by etching in the eighth step. The etch stop layer may use an n-type InGaAs layer, in which case the content of In as a group III element in InGaAs is preferably 0.3 to 0.7, more preferably 0.5 to 0.6 so that the etch stop layer can be lattice matched with the InP growth substrate 10.

Second Step

As described above, the second step is a step where the contact layer formed of a III-V compound semiconductor is formed on the semiconductor laminate 30 (Step 1C in FIG. 1). For example, as illustrated in Step 1C of FIG. 1, the p-type contact layer 41 can be formed on the p-type cap layer 39. The p-type contact layer 41 is a layer which is in contact with the ohmic metal portion 43, is interposed between the ohmic metal portion 43 and the semiconductor laminate 30, and has a composition allowing for lower contact resistance with the ohmic metal portion 43 than with the semiconductor laminate 30. For example, a p-type InGaAs layer can be used as the p-type contact layer 41. The thickness of the contact layer 41 may be for example, but not limited to, 50 nm to 200 nm.

Third Step

Figure 2:
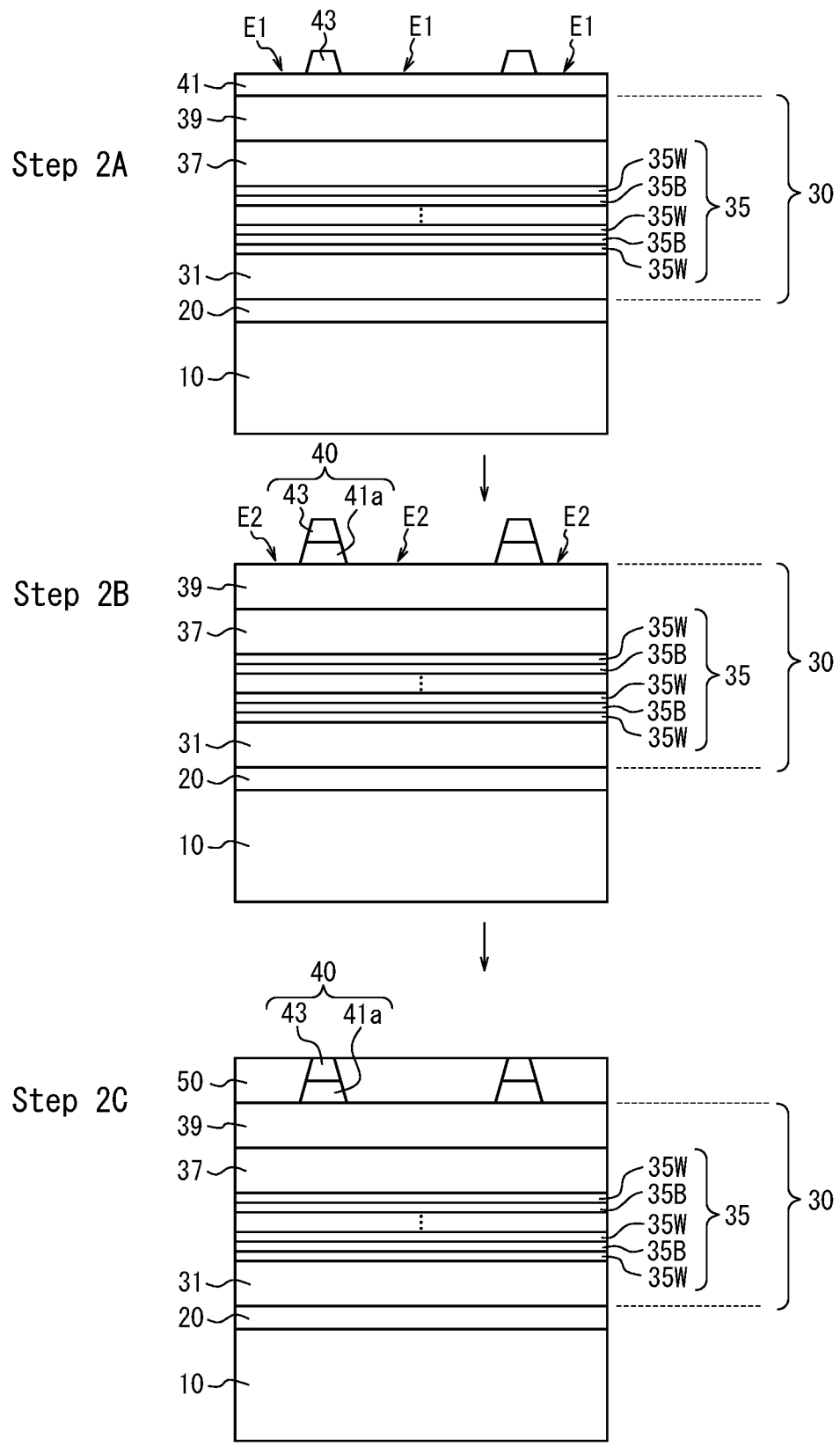
FIG. 2 presents schematic cross-sectional views illustrating Steps 2A to 2C of the manufacturing process of a semiconductor light-emitting diode according to the first embodiment of this disclosure.

As described above, the third step is a step where the ohmic metal portion 43 is formed on part of the contact layer 41 leaving the exposed area E1 on a surface of the contact layer 41 (Step 2A in FIG. 2). The ohmic metal portion 43 can be formed into islands distributed in a predetermined pattern. When a p-type InGaAs layer is used as the p-type contact layer 41, for example, Au, AuZn, AuBe, AuTi, etc. can be used as the ohmic metal portion 43, and a structure in which those materials are stacked can preferably be used as the ohmic metal portion 43. For example, Au/AuZn/Au (a stack of Au, AuZn, and Au in this order) may be used as the ohmic metal portion 43. The thickness (or the total thickness) of the ohmic meal portion 43 may be for example, but not limited to 300 nm to 1300 nm, preferably 350 nm to 800 nm.

Here, for example, the third step can be performed by forming a resist pattern on a surface of the contact layer 41, vapor depositing the ohmic metal portion 43, and removing the resist pattern by lift-off to obtain the ohmic metal portion 43. Alternatively, the third step can be performed by forming a predetermined metal layer on the entire surface of the contact layer 41, forming a mask on the metal layer, and performing for example etching to form the ohmic metal portion 43. In either case, as illustrated in Step 2A of FIG. 2, the ohmic metal portion 43 is formed on part of the contact layer 41, the surface of the contact layer 41 which is not in contact with the ohmic metal portion 43, that is, the exposed area E1 is formed.

The shape of the ohmic metal portion 43 may be a trapezoidal shape in a cross-sectional view in some cases as illustrated in Step 2A of FIG. 2 by way of schematic illustration only. The ohmic metal portion 43 may be formed into a rectangular shape or may have rounded corners in a cross-sectional view.

Fourth Step

As described above, the fourth step is a step where the contact layer 41 of the exposed area E1 is removed so that a surface of the semiconductor laminate 30 is exposed, thereby forming the contact portion 40 composed of the ohmic metal portion 43 and the contact layer 41a and forming the exposed surface E2 of the semiconductor laminate 30 (Step 2B in FIG. 2). Specifically, the contact layer 41 of an area other than the areas of the ohmic metal portion 43 formed in the previous third step is etched to expose a surface of the p-type cap layer 39 which is the outermost surface layer of the semiconductor laminate 30, thereby obtaining the contact layer 41a. For example, a resist mask may be formed on and around (approximately 2 μm to 5 μm) the ohmic metal portion 43, and the exposed area E1 of the contact layer 41 may be wet etched using tartaric acid-hydrogen peroxide mixture. Alternatively, wet etching may be performed using inorganic acid-hydrogen peroxide mixture, organic acid-hydrogen peroxide mixture, etc. Further, when a mask is formed on a metal layer and etching is performed to form the ohmic metal portion 43 in the third step, the etching of the fourth step can be performed in continuity with the etching in the third step.

Note that the thickness of the contact portion 40 corresponds to the total thickness of the contact layer 41 (41a) and the ohmic metal portion 43 and may be 350 nm to 1500 nm, more preferably 400 nm to 1000 nm.

Fifth Step

As described above, the fifth step is a step where the dielectric layer 50 is formed on at least part of the exposed surface E2 of the semiconductor laminate 30 (Step 2C in FIG. 2). Such a dielectric layer 50 may be formed for example as follows.

First, a dielectric layer is deposited on the entire surface of the semiconductor laminate 30 so as to cover the semiconductor laminate 30 and the contact portion 40. For the film deposition, a known technique such as plasma CVD or sputtering can be used. When a dielectric on a contact portion is formed in the dielectric layer 50 above the contact portion 40 in the surface of the deposited dielectric layer, a mask may be formed as desired and the dielectric on the contact portion may be removed by etching etc. For example, the dielectric on the contact portion may be wet etched using buffered hydrofluoric acid (BHF) or the like.

Further, as illustrated in FIG. 5, it is also preferred that the dielectric layer 50 is formed on part of the exposed surface E2 of the semiconductor laminate 30 leaving an exposed portion E3 around the contact portion 40. The dielectric layer 50 and the exposed portion E3 described above may be formed for example as follows. First, a dielectric layer is deposited on the entire surface of the semiconductor laminate 30, and a window pattern completely surrounding the contact portion is formed using resist above the contact portion 40 in the surface of the deposited dielectric layer. In this case, the window pattern is preferably 1 μm to 5 μm larger than the contact portion both in the width direction and the length direction. Using the thus formed resist pattern to remove the dielectric around the contact portion by etching, the dielectric layer 50 can be formed, and the exposed portion E3 is formed around the contact portion 40.

Such an exposed portion E3 is preferably provided, since a heat dissipation path of the semiconductor light-emitting diode 100 is formed. In order to ensure this effect, the width W of the exposed portion E3 is preferably 0.5 μm or more and 5 μm or less, more preferably 1 μm or more and 3.5 μm or less (see FIG. 5).

Note that the ratio of the area of the dielectric layer 50 in contact with the semiconductor laminate 30 (contact area ratio) is preferably 80% or more 95% or less. When the area of the contact portion 40 is reduced and the area of the dielectric layer 50 is increased, absorption of light by the contact portion can be reduced. Note that the contact area ratio can be measured on a wafer, and when the contact area ratio is calculated backwards from the state of singulated semiconductor light-emitting diodes, the calculation can be performed assuming that the width of the semiconductor layer at each end (a region where the electric layer has been present) removed by singulation is 20 μm to 30 μm (40 μm to 60 μm for both ends in total).

Note that in the fifth step, the relationship between the thickness $H_1$ of the dielectric layer 50 and the thickness $H_2$ of the contact portion 40 is not limited in particular; however, as illustrated in FIG. 5, when the thickness of the dielectric layer 50 is expressed as $H_1$ and the thickness of the contact portion is expressed as $H_2$, $H_2 \geq H_2$ can be satisfied, and $H_1 > H_2$ is preferably satisfied. Under these conditions, the thickness of the dielectric layer 50 may be for example, but not limited to 360 nm to 1600 nm, more preferably 410 nm to 1100 nm. Further, the difference between the thickness $H_1$ of the dielectric layer and the thickness $H_2$ of the contact portion 40: $H_1 - H_2$ is preferably 10 nm or more and 100 nm or less.

Moreover, the dielectric layer 50 may use $SiO_2$, SiN, ITO, AlN, etc., and the dielectric layer 50 is preferably formed of $SiO_2$ in particular. $SiO_2$ can easily be treated by etching using BHF etc.

Sixth Step

As describe above, the sixth step is a step where the reflective metal layer 60 mainly containing Au is formed on the dielectric layer 50 and the contact portion 40 (Step 3A in FIG. 3). In the fifth step, when the exposed portion E3 is formed, the reflective metal layer 60 is formed also on the exposed portion E3. The reflective metal layer 60 "mainly containing Au" means that Au composes more than 50% by mass in the composition of the reflective metal layer 60, and preferably Au composes 80% by mass or more. The reflective metal layer 60 may include a plurality of metal layers; however, when it includes a metal layer formed of Au (hereinafter "Au metal layer"), the thickness of the Au metal layer is preferably more than 50% of the total thickness of the reflective metal layer 60. Other than Au; Al, Pt, Ti, Ag, etc. may be used as metals composing the reflective metal layer 60. For example, the reflective metal layer 60 may be constituted by a single layer formed of Au only; alternatively, the reflective metal layer 60 may include two or more Au metal layers. In order to ensure bonding in the subsequent seventh step, the outermost surface layer of the reflective metal layer 60 (the surface opposite to the semiconductor laminate 30) is preferably a Au metal layer. For example, metal layers of Al, Au, Pt, and Au may be formed in this order on the dielectric layer 50, the exposed portion E3, and the contact portion 40 to obtain the reflective metal layer 60. The thickness of one Au metal layer in the reflective metal layer 60 may be for example 400 nm to 2000 nm, and the thickness of each metal layer formed of a metal other than Au may be for example 5 nm to 200 nm. The reflective metal layer 60 can be formed on the dielectric layer 50, the exposed portion E3, and the contact portion 40 by a typical technique such as a vapor deposition process.

Seventh Step

As described above, the seventh step is a step where the conductive support substrate 80 having a surface provided with the metal bonding layer 70 is bonded to the reflective metal layer 60 with the metal bonding layer 70 therebetween (Step 3B in FIG. 3). On a surface of the conductive support substrate 80, the metal bonding layer 70 may previously be formed by sputtering, vapor deposition, etc. The metal bonding layer 70 and the reflective metal layer 60 are placed to face each other and put together, followed by bonding of the layers by thermocompression bonding at a temperature of approximately 250° C. to 500° C.

The metal bonding layer 70 bonded to the reflective metal layer 60 may be of metals such as Ti, Pt, and Au, or metals forming a eutectic alloy with gold (e.g., Sn), and is preferably formed from a laminate of those materials. For example, a laminate obtained by stacking Ti with a thickness of 400 nm to 800 nm, Pt with a thickness of 5 nm to 20 nm, and Au with a thickness of 700 nm to 1200 nm in this order on the surface of the conductive support substrate 80 can be used as the bonging layer 70. Note that in order to facilitate bonding between the reflective metal layer 60 and the metal bonding layer 70, a Au metal layer is provided as the outermost surface layer of the metal bonding layer 70, and Au is also provided as a metal layer of the reflective bonding layer 60 on the metal bonding layer 70 side to perform bonding between Au and Au by Au-Au diffusion bonding.

Here, a conductive Si substrate transparent to near infrared wavelengths is used as the conductive support substrate 80. A Si substrate hardly breaks, since it has higher hardness than an InP substrate. Accordingly, as compared with the case of using an InP substrate, the thickness of the conductive support substrate 80 can be significantly reduced when a Si substrate is used. Further, a Si substrate is also more advantageous in terms of heat dissipation and cost as compared with an InP substrate.

Eighth Step

As described above, the eighth step is a step where the InP growth substrate 10 is removed (Step A in FIG. 4). The InP growth substrate 10 can be removed by wet etching for example using a hydrochloric acid diluent, and when the etch stop layer 20 is formed, etching can be stopped by this layer. The etch stop layer being an n-type InGaAs layer may be removed by wet etching for example using sulfuric acid-hydrogen peroxide mixture.

As described above, the semiconductor light-emitting diode 100 can be fabricated. This semiconductor light-emitting diode 100 uses a conductive Si substrate as the conductive support substrate 80, so that the thickness of the support substrate can be made sufficiently smaller than the case of using an InP substrate as the support substrate. Accordingly, the total thickness of the semiconductor light-emitting diode 100 can be made small, thus the semiconductor light-emitting diode 100 can be made small. Further, since the reflective metal layer 60 is provided on the Si substrate of the semiconductor light-emitting diode 100, light is emitted from the surface of the diode opposite to the Si substrate. On the other hand, in a conventional semiconductor light-emitting diode in which an InP substrate is used as a growth substrate and as a support substrate, light is emitted from both surface of the semiconductor laminate and side surfaces thereof. Accordingly, the semiconductor light-emitting diode 100 according to this embodiment is also useful in that the directivity of the emitted light is higher than the case of conventional semiconductor light-emitting diodes.

Here, although not shown, the manufacturing method according to this embodiment preferably further includes a grinding step of grinding the conductive support substrate 80 to a thickness in a range of 80 μm or more and less than 200 μm. In this embodiment, since a Si substrate is used as the conductive support substrate 80, the conductive support substrate 80 would not be broken even if it is ground to a thickness of less than 200 μm. Further, the conductive support substrate 80 can be ground to a thickness of 150 μm or less, or may be ground to a thickness of 100 μm or less. However, when the conductive support substrate 80 is ground to a thickness of less than 80 μm, even a Si substrate would be damaged. Therefore, the lower limit of the thickness is preferably set to 80 μm. Further, when the thickness of the conductive support substrate 80 is 80 μm or more, the semiconductor light-emitting diode 100 is sufficiently handleable.

This grinding step may be performed prior to the above seventh step, may be performed between the seventh step and the eighth step, or may be performed after the eighth step. Preferably, the grinding step is performed after the eighth step. Use of a thinned wafer reduces the process step, which prevents the breakage of the wafer more reliably. When the grinding step is performed after the eighth step, the grinding step is performed before the formation of the back electrode to be described. Note that the grinding of the conductive support substrate 80 formed from a Si substrate may be performed by typical mechanical grinding, and etching may be performed in addition to the mechanical grinding.

The manufacturing method according to this embodiment may further have a step of forming, after the fabrication of the semiconductor light-emitting diode 100, a back electrode 91 on the back surface of the conductive support substrate 80 and forming a top electrode 93 on the surface of the semiconductor laminate 30 as illustrated in Step 4B of FIG. 4. The top electrode 93 may include a wiring portion 93a and a pad portion 93b. Through such steps, a semiconductor light-emitting diode 100' can be fabricated. The back electrode 91 and the top electrode 93 can be formed by a known technique; for example, sputtering, electron-beam physical vapor deposition, resistance heating, etc. can be used.

Further, since an n-type InP substrate is used as the InP growth substrate 10 in this embodiment for convenience of description, the layers formed on the InP growth substrate 10 have n-type and p-type conductivity types as described above. On the other hand, when a p-type InP substrate is used as the InP growth substrate 10, it can naturally be understood that those layers have n-type and p-type conductivity types in reverse order. Further, when an undoped InP substrate is used as the InP growth substrate 10, the conductivity type of those layers may be determined to correspond to the conductivity (p-type or n-type) of the semiconductor layers formed on the InP growth substrate 10.

First Embodiment: Semiconductor Light-Emitting Diode

The semiconductor light-emitting diode 100 according to the first embodiment of this disclosure can be fabricated by the manufacturing method of the above embodiment. The semiconductor light-emitting diode 100 is a vertical semiconductor light-emitting diode 100 which operates when electric current flows in a vertical direction. Specifically, as illustrated in Step 4A of FIG. 4, this semiconductor light-emitting diode 100 has the conductive support substrate 80; the metal bonding layer 70 provided on the surface of the conductive support substrate 80; the reflective metal layer 60 provided on the metal bonding layer 70; the semiconductor laminate 30 in which a plurality of InGaAsP-based III-V compound semiconductor layers containing at least In and P are stacked, provided on the metal reflective layer 60; and the dielectric layer 50 and the contact portion 40 which are provided in parallel between the reflective metal layer 60 and the semiconductor laminate 30. The main component of the reflective metal layer 60 is Au, and the conductive support substrate 80 is formed from a conductive Si substrate.

As described above, this semiconductor light-emitting diode 100 uses a conductive Si substrate as the conductive support substrate 80, so that the thickness of the support substrate can be made sufficiently small. Moreover, the semiconductor light-emitting diode 100 is also useful in that the directivity of the emitted light is higher than in the case of conventional semiconductor light-emitting diodes, since the reflective metal layer 60 is provided on the Si substrate side.

Further, in this embodiment, the thickness of the conductive support substrate 80 can be 80 μm or more and less than 200 μm, and the thickness can be 150 μm or less, or 100 μm or less.

Preferably, the semiconductor laminate 30 includes an n-type cladding layer 31, an active layer 35, and a p-type cladding layer 37 in this order, and the n-type cladding layer 31, the active layer 35, and the p-type cladding layer 37 are layers formed of an InGaAsP-based III-V compound semiconductor containing at least In and P. Also as described above, the semiconductor laminate 30 may have a double hetero structure in which the active layer 35 is sandwiched between the n-type cladding layer 31 and the p-type cladding layer 37 or a multiple quantum well structure, and the active layer 35 preferably has multiple quantum well structure. The dielectric layer is preferably formed of $SiO_2$.

As described in the embodiment of the manufacturing method, the semiconductor light-emitting diode 100 may have another optional structure. Further, as illustrated in Step 4B of FIG. 4, the back electrode 91 and the top electrode 93 may be provided on the semiconductor light-emitting diode 100 to obtain the semiconductor light-emitting diode 100'.

Second Embodiment: Semiconductor Light Receiving Device

A method of manufacturing a semiconductor optical device and a semiconductor optical device according to this disclosure can be applied to an embodiment of a semiconductor light receiving device. For example, when a semiconductor laminate including for example an InGaAs light absorption layer and an InP window layer is provided instead of the semiconductor laminate 30 in the semiconductor light-emitting diode 100, the semiconductor optical device can be used as a semiconductor light receiving device. Since a semiconductor light receiving device according to this disclosure uses a Si substrate as a conductive support substrate, as in the semiconductor light-emitting diode 100, the thickness of the conductive support substrate can be made small, and hence the total thickness of the semiconductor light receiving device can be made small; thus, a small semiconductor light receiving device can be obtained.

Third Embodiment: Method of Manufacturing Semiconductor Optical Device

Further, the use of a conductive support substrate formed from a Si substrate in a semiconductor optical device using a III-V compound semiconductor containing In and P, formed on an InP substrate according to this disclosure, can of course be applied to the following method of manufacturing a semiconductor optical device of the third embodiment.

Figure 6:
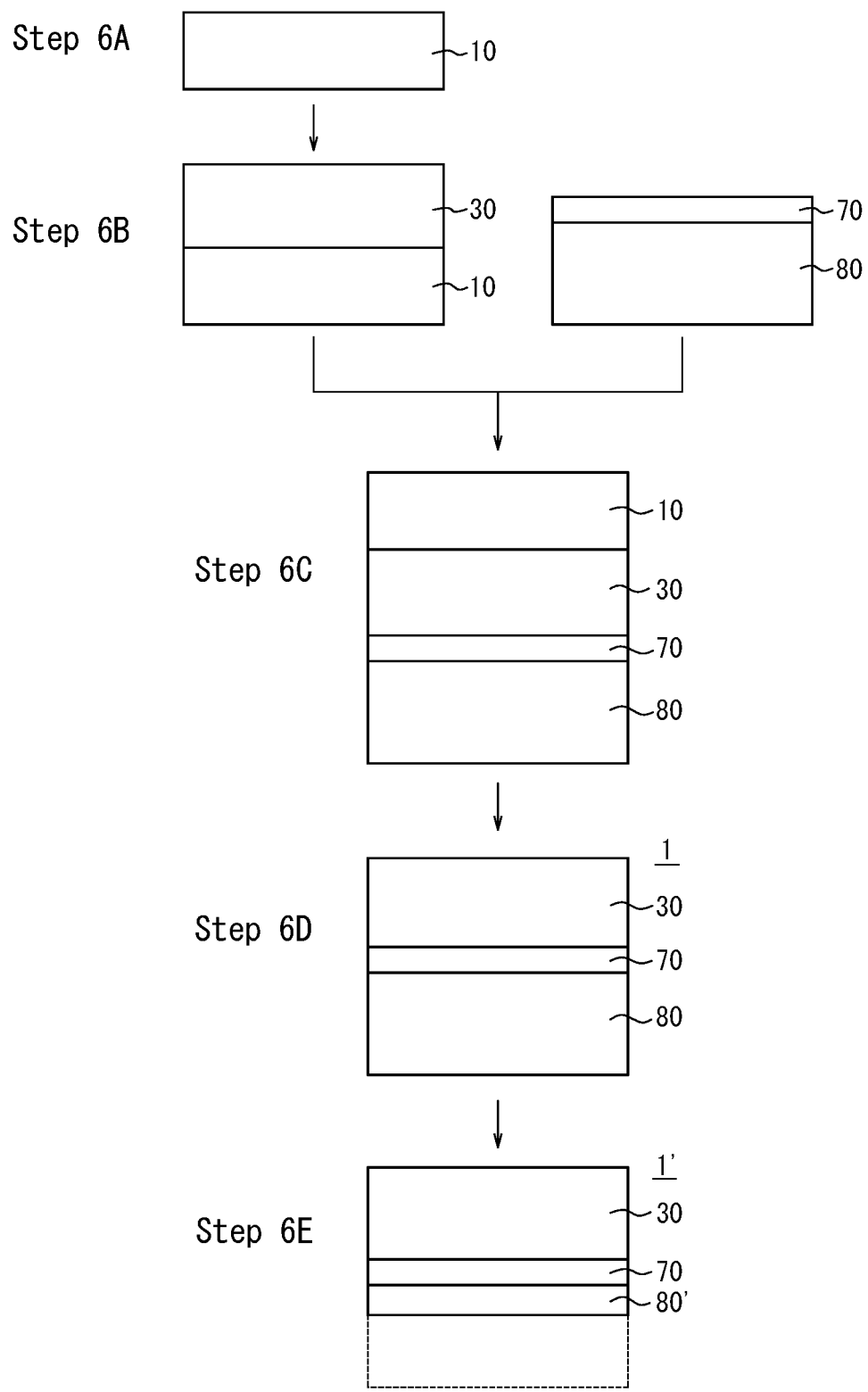
FIG. 6 presents schematic cross-sectional views illustrating Steps 6A to 6E of a manufacturing process of a semiconductor optical device according to a third embodiment of this disclosure.

As illustrated in FIG. 6, a method of manufacturing a semiconductor optical device 1 according to the third embodiment of this disclosure includes a step of forming the semiconductor laminate 30 in which a plurality of InGaAsP-based III-V compound semiconductor layers containing at least In and P are stacked, on the InP growth substrate (Steps 6A and 6B of FIG. 6); a step of bonding the semiconductor laminate 30 to the conductive support substrate 80 formed from a Si substrate, with at least the metal bonding layer 70 therebetween (Step 6C of FIG. 6); and a step of removing the InP growth substrate 10 (Step 6D of FIG. 6).

Since the semiconductor optical device 1 uses a Si substrate as the conductive support substrate 80, the semiconductor optical device 1 can be made smaller than conventional semiconductor optical devices using an InP growth substrate as a conductive support substrate. Hence, the manufacturing method according to this embodiment preferably further includes a grinding step of grinding the conductive support substrate 80 to a thickness in a range of 80 μm or more and less than 200 μm (Step 6E of FIG. 6). Thus, the small semiconductor optical device 1' can be manufactured, in which the thickness of the conductive support substrate 80 is in a range of 80 μm or more and less than 200 μm.

Third Embodiment: Semiconductor Optical Device

Further, the semiconductor optical device 1 of this disclosure can be fabricated by the manufacturing method of the above embodiment. Specifically, as illustrated in Step 6D of FIG. 6, the semiconductor optical device 1 of this disclosure has the conductive support substrate 80 formed from a Si substrate; a metal bonding layer 70 provided on the surface of the conductive support substrate 80; and the semiconductor laminate 30 obtained by stacking a plurality of InGaAsP-based III-V compound semiconductor layers containing at least In and P are stacked, provided on the metal bonding layer 70.

Further, as illustrated in Step 6E of FIG. 6, the thickness of the conductive support substrate 80 is preferably in a range of 80 μm or more and less than 200 μm. Thus, the semiconductor optical device 1' can be made small.

Note that in an embodiment of a semiconductor optical device and a method of manufacturing the same according to the third embodiment, any given structure of the semiconductor light-emitting diode and the semiconductor light receiving device according to the first embodiment and the second embodiment can be applied to the semiconductor optical device 1 (1').

EXAMPLES

Example 1

The disclosed method of manufacturing a semiconductor optical device will be described in more detail below using examples. However, this disclosure is not limited to the following examples. A semiconductor light-emitting diode of Example 1 was fabricated in accordance with the process steps illustrated in FIGS. 1 to 4. The steps are demonstrated as follows.

First, on the (100) plane of an n-type InP substrate, an n-type $In_{0.57}Ga_{0.43}As$ etch stop layer, an n-type InP cladding layer (thickness: 2 μm), an i-type InP spacer layer (thickness: 300 nm), an active layer having a quantum well structure with an emission wavelength of 1300 nm (130 nm in total), an i-type InP spacer layer (thickness: 300 nm), a p-type InP cladding layer (thickness: 1.2 μm), a p-type $In_{0.8}Ga_{0.20}As_{0.5}P_{0.5}$ cap layer (thickness: 50 nm), and a p-type $In_{0.57}Ga_{0.43}As$ contact layer (thickness: 130 nm) were sequentially formed by MOCVD. Note that in forming the active layer having a quantum well structure, ten $In_{0.73}Ga_{0.27}As_{0.5}P_{0.5}$ well layers (thickness: 5 nm) and ten InP barrier layers (thickness: 8 nm) were alternately stacked.

Figure 7A:
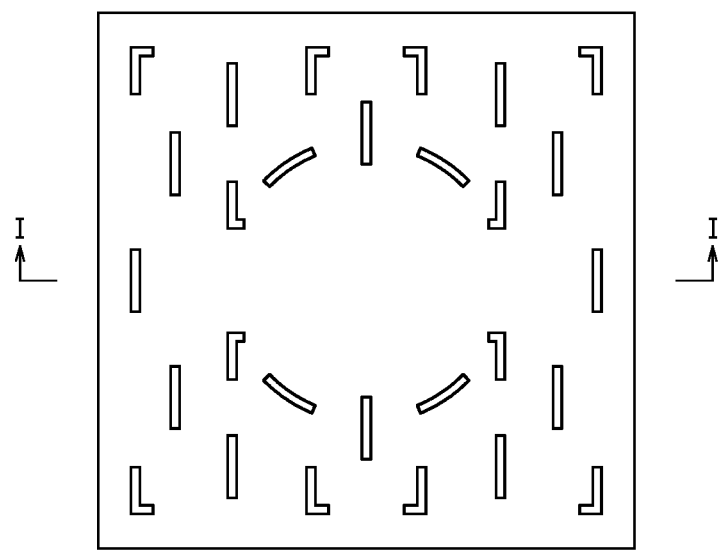
FIG. 7A is a schematic top view illustrating a pattern of an ohmic electrode portion of Examples.

On the p-type $In_{0.57}Ga_{0.43}As$ contact layer, a p-type ohmic electrode portion (Au/AuZn/Au, total thickness: 530 nm) was formed into islands distributed as illustrated in FIG. 7A. The cross-sectional view of FIG. 7A taken along line I-I corresponds to the schematic cross-sectional view of Step 2A in FIG. 2. When forming this pattern, a resist pattern was formed and an ohmic electrode was then vapor deposited, followed by lift-off of the resist pattern. When the semiconductor layer of the wafer in this state was observed in a top view using an optical microscope, the contact area ratio of the p-type ohmic electrode portion with respect to the semiconductor layer was 4.5%. Note that the outer size of the object depicted in FIG. 7A is 380 μm square.

Next, a resist mask was formed on and around the p-type ohmic electrode portion, and the p-type $In_{0.57}Ga_{0.43}As$ contact layer was removed, except for areas where the ohmic electrode portion was formed, by wet etching using tartaric acid-hydrogen peroxide mixture. After that, a dielectric layer (thickness: 700 nm) made of $SiO_2$ was formed on the entire surface of the p-type $In_{0.80}Ga_{0.20}As_{0.50}P_{0.50}$ cap layer by plasma CVD. A window pattern having a shape extending over 3 μm each in the width direction and the longitudinal direction in an area above the p-type ohmic electrode portion was formed using resist, and the dielectric layer on and around the p-type ohmic electrode portion was removed by wet etching using BHF to expose the p-type $In_{0.80}Ga_{0.20}As_{0.50}P_{0.50}$ cap layer. At this time, the height $H_1$ (700 nm) of the dielectric layer on the p-type $In_{0.80}Ga_{0.20}As_{0.50}P_{0.50}$ cap layer is larger than the height H2 (660 nm) of the contact portion composed of the p-type contact layer (thickness: 130 nm) and the p-type ohmic electrode portion (thickness: 530 nm) by 40 nm. When the semiconductor layer of the wafer in this state was observed in a top view using an optical microscope, the contact area ratio of the dielectric layer ($SiO_2$) was 90%.

Next, a reflective metal layer (Al/Au/Pt/Au) was formed on the entire surface of the p-type $In_{0.80}Ga_{0.20}As_{0.50}P_{0.50}$ cap layer by vapor deposition. The thickness of the metal layers in the reflective metal layer was 10 nm, 650 nm, 100 nm, and 900 nm in this order.

On the other hand, a metal bonding layer (Ti/Pt/Au) was formed on a conductive Si substrate serving as a support substrate (thickness: 300 μm). The thickness of the metal layers in the metal bonding layer was 650 nm, 10 nm, and 900 nm in this order.

The reflective metal layer and the metal bonding layer were placed to face one another and were subjected to thermocompression bonding at 300° C. Further, the InP substrate was removed by wet etching using a hydrochloric acid diluent, and the n-type $In_{0.57}Ga_{0.43}As$ etch stop layer was removed by wet etching using sulfuric acid-hydrogen peroxide mixture.

Figure 7B:
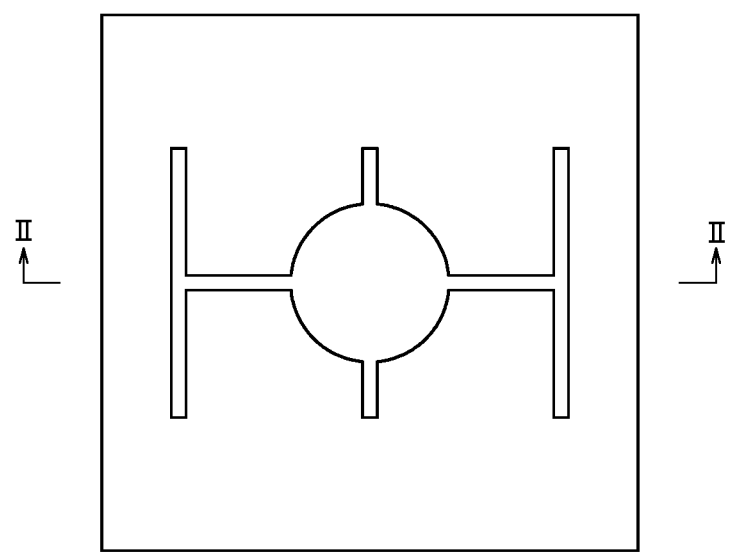
FIG. 7B is a schematic top view illustrating a pattern of a top electrode of Examples.

Next, on the n-type InP cladding layer, an n-type electrode (Au (thickness: 10 nm)/Ge (thickness: 33 nm)/Au (thickness: 57 nm)/Ni (thickness: 34 nm)/Au (thickness: 800 nm)/Ti (thickness: 100 nm)/Au (thickness: 1000 nm)) was formed as a wiring portion of a top electrode by resist pattern formation, vapor deposition of an n-type electrode, and lift-off of the resist pattern as illustrated in FIG. 7B. Further, a pad portion (Ti (thickness: 150 nm)/Pt (thickness: 100 nm)/Au (thickness: 2500 nm)) was formed on the n-type electrode to obtain the top electrode having a pattern as illustrated in FIG. 7B. The cross-sectional view of FIG. 7B taken along line II-II corresponds to Step 4B in FIG. 4. Note that the outer size of the object depicted in FIG. 7B is 380 μm square as with FIG. 7A.

Finally, the semiconductor layers between devices (width: 60 μm) were removed by mesa etching to form dicing lines. A back electrode (Ti (thickness: 10 nm)/Pt (thickness: 50 nm)/Au (thickness: 200 nm)) was formed on the back surface of the Si substrate, and chip singulation was performed by dicing to obtain a semiconductor light-emitting diode of Example 1. The chip size was 350 μm×350 μm.

Example 2

A semiconductor light-emitting diode according to Example 2 was fabricated in the same manner as in Example 1 except that the Si substrate was ground to a thickness of approximately 87 μm immediately before forming the back electrode on the Si substrate to obtain a semiconductor light-emitting diode having a total thickness of 120 μm.

Conventional Example 1

A semiconductor light-emitting diode according to Conventional Example 1 was fabricated as follows. First, on the (100) plane of an n-type InP substrate, an n-type InP cladding layer (thickness: 2 μm), an i-type InP spacer layer (thickness: 300 nm), an active layer having a quantum well structure with an emission wavelength of 1300 nm (130 nm in total), an i-type InP spacer layer (thickness: 300 nm), a p-type InP cladding layer (thickness: 1.2 μm), a p-type $In_{0.80}Ga_{0.20}As_{0.50}P_{0.50}$ cap layer (thickness: 50 nm), and a p-type $In_{0.57}Ga_{0.43}As$ contact layer (thickness: 130 nm) were sequentially formed by MOCVD. A back electrode (Ti (thickness: 10 nm)/Pt (thickness: 50 nm)/Au (thickness: 200 nm)) was formed on the back surface of the n-type InP substrate, a top electrode (AuGe/Ni/Au electrode) was formed on a center portion of the p-type $In_{0.57}Ga_{0.43}As$ contact layer, and singulation was performed as in Example 1. Note that in forming the active layer having a quantum well structure, ten $In_{0.73}Ga_{0.27}As_{0.50}P_{0.50}$ well layers (thickness: 5 nm) and ten InP barrier layers (thickness: 8 nm) were alternately stacked.

Comparative Example 1

In Conventional Example 1, a semiconductor light-emitting diode was fabricated in the same manner as in Conventional Example 1 except that a InP substrate was ground immediately before forming a back electrode on an InP substrate. However, the InP substrate was broken in the grinding before the thickness of the InP substrate reached 150 μm and the device was not completed in Comparative Example 1.

Evaluation 1: Grinding Tolerance Evaluation

As can be seen from the comparison between Example 1 and Example 2, when a Si substrate was used as the conductive support substrate, the semiconductor light-emitting diode having a total thickness of 120 μm was obtained by grinding the Si substrate, thus a small semiconductor light-emitting diode with a center emission wavelength of 1300 nm was obtained. On the other hand, as can be seen from the comparison between Conventional Example 1 and Comparative Example 1, since the InP substrate was broken while being ground, thus a small semiconductor light-emitting diode was not obtained.

Evaluation 2: Light Distribution Characteristics Evaluation

Figure 8A:
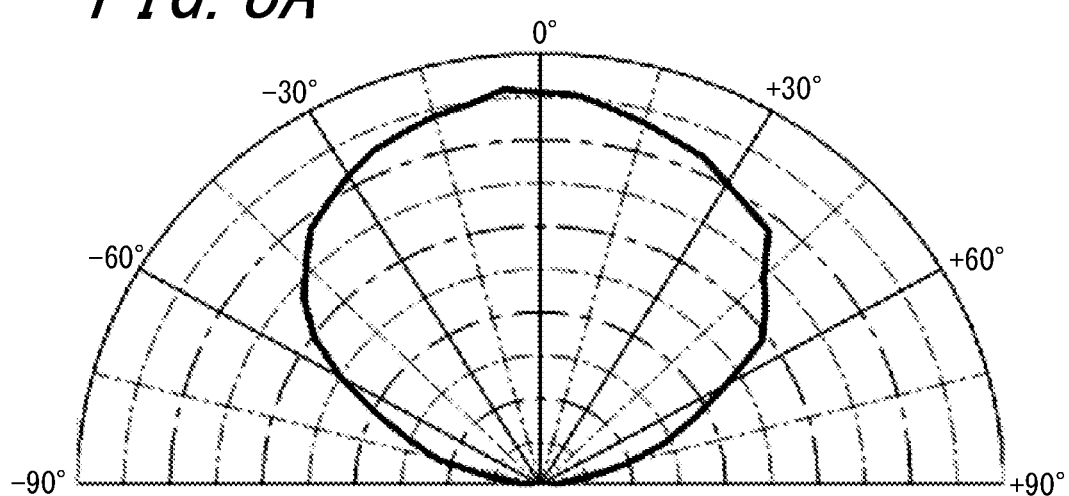
FIG. 8A is a graph depicting a light distribution pattern of Example 1.
Figure 8B:
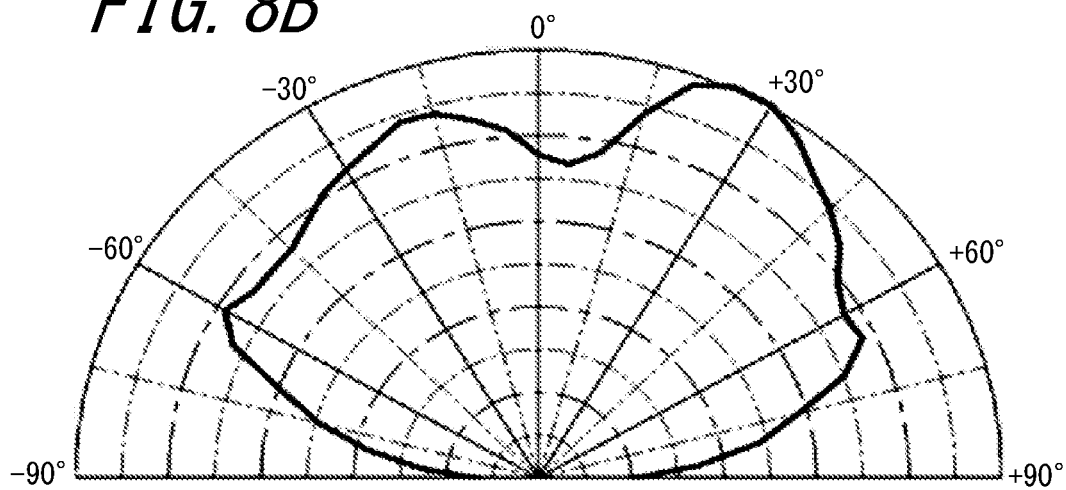
FIG. 8B is a graph depicting a light distribution pattern of Conventional Example 1.

An electric current of 20 mA was flown to each semiconductor light-emitting diode obtained in Example 1 and Conventional Example 1, and a light distribution pattern was identified using a spectrophotometer. Note that the identification was performed while the semiconductor light-emitting diode was rotated 180° with a solid angle of $6 \times 10^{-3}$ steradians and the distance between the semiconductor light-emitting diode and the spectrophotometer was 20 cm. The light distribution patterns of Example 1 and Conventional Example 1 are presented in FIGS. 8A and 8B, respectively. As seen from FIGS. 8A and 8B, higher directivity was achieved in Example 1 than in Conventional Example 1.

Evaluation 3: Light Output Power Evaluation

The forward voltage Vf at a 20 mA current supplied to each of the semiconductor light-emitting diodes obtained in Example 1 and Conventional Example 1 by a constant current constant voltage power supply was measured and the light output power Po thereof was measured using an integrating sphere. The measurement was performed on three samples for each example, and the average of the measurement results for each example was calculated. The results are given in Table 1. The peak emission wavelength was measured using a fiber optic spectrometer in Example 1 and Conventional Example 1 and was in a range of 1290 nm to 1310 nm in each example.

TABLE 1

|  | Light output power Po (mW) | Forward voltage Vf (V) |
|---|---|---|
| Example 1 | 1.97 | 1.01 |
| Conventional Example 1 | 0.56 | 1.04 |

The above results confirmed that a small semiconductor light-emitting diode can be embodied with the use of a Si substrate in accordance with Examples 1 and 2 meeting the conditions of this disclosure. Further, since the reflective metal layer is used, Examples 1 and 2 are more advantageous than Conventional Example 1 in terms of achieving high directivity. Further, comparison of Example 1 and Conventional Example 1 confirmed that the light output power was substantially increased while the forward voltage was slightly reduced in Example 1, as compared with Conventional Example 1.

INDUSTRIAL APPLICABILITY

This disclosure advantageously provides a method of manufacturing a semiconductor optical device, which makes it possible to reduce the thickness of a semiconductor optical device including InGaAsP-based III-V compound semiconductor layers containing at least In and P to a thickness smaller than that of conventional devices, and provides a semiconductor optical device. In particular, for a semiconductor light-emitting diode, high directivity and substantially increased light output power can be achieved, thus, the diode can be used as a high-performance semiconductor light-emitting diode.

REFERENCE SIGNS LIST 1, 1': Semiconductor optical device
10: InP growth substrate
20: Etch stop layer
30: Semiconductor laminate
31: N-type cladding layer
35: Active layer
35W: Well layer
35B: Barrier layer
37: P-type cladding layer
39: P-type cap layer
40: Contact portion
41 (41a): P-type contact layer
43: Ohmic metal portion
50: Dielectric layer
60: Reflective metal layer
70: Metal bonding layer
80: Support substrate (Conductive support substrate)
100, 100': Semiconductor light-emitting diode
91: Back electrode
93: Top electrode
E1: Exposed area
E2: Exposed surface
E3: Exposed portion

The invention claimed is:
1. A method of manufacturing a semiconductor optical device, comprising:
a first step of forming a semiconductor laminate in which a plurality of InGaAsP-based III-V compound semi- conductor layers containing at least In and P are stacked, on an InP growth substrate;

a second step of forming a contact layer formed of a III-V compound semiconductor on the semiconductor laminate;

a third step of forming an ohmic metal portion on a part of the contact layer leaving an exposed area on a surface of the contact layer;

a fourth step of removing the contact layer of the exposed area, thereby forming a contact portion composed of the ohmic metal portion and the contact layer and forming an exposed surface of the semiconductor laminate;

a fifth step of forming a dielectric layer on at least a part of the exposed surface of the semiconductor laminate;

a sixth step of forming a reflective metal layer mainly containing Au on the dielectric layer and the contact portion;

a seventh step of bonding a conductive support substrate having a surface provided with a metal bonding layer to the reflective metal layer with the metal bonding layer interposed between the conductive support substrate and the reflective metal layer; and an eighth step of removing the InP growth substrate, wherein the conductive support substrate is a conductive Si substrate.

2. The method of manufacturing the semiconductor optical device, according to claim 1, further comprising a grinding step of grinding the conductive support substrate to a thickness in a range of 80 μm or more and less than 200 μm.

3. The method of manufacturing the semiconductor optical device, according to claim 1, wherein the semiconductor laminate includes an n-type cladding layer, an active layer, and a p-type cladding layer in this order.

4. The method of manufacturing the semiconductor optical device, according to claim 3, wherein the semiconductor laminate has one of a double heterostructure and a multiple quantum-well structure.

5. The method of manufacturing the semiconductor optical device, according to claim 1, wherein the dielectric layer is formed of $SiO_2$.

* * * * *